(12) United States Patent
Lee

(10) Patent No.: US 7,205,909 B2
(45) Date of Patent: Apr. 17, 2007

(54) TOUCH PANEL DEVICE AND METHOD OF FABRICATING THE SAME

(75) Inventor: Sook Jin Lee, Kyoungsangbuk-do (KR)

(73) Assignee: LG.Philips LCD Co. Ltd., Seoul (KR)

( * ) Notice: Subject to any disclaimer, the term of this patent is extended or adjusted under 35 U.S.C. 154(b) by 436 days.

(21) Appl. No.: 10/606,797

(22) Filed: Jun. 27, 2003

(65) Prior Publication Data

US 2004/0041796 A1   Mar. 4, 2004

(30) Foreign Application Priority Data

Aug. 30, 2002   (KR) .................... 10-2002-0051858

(51) Int. Cl.
 *H03K 17/94* (2006.01)
 *H03M 11/00* (2006.01)
(52) U.S. Cl. .................... 341/20; 341/22; 341/23; 345/173; 345/175; 345/177
(58) Field of Classification Search .............. 341/20, 341/22, 23; 345/177, 173, 175; 333/153
See application file for complete search history.

(56) References Cited

U.S. PATENT DOCUMENTS

| 4,413,252 A | * | 11/1983 | Tyler et al. .................... 341/33 |
| 5,461,202 A | * | 10/1995 | Sera et al. .................... 174/254 |
| 6,108,211 A | * | 8/2000 | Diessner .................... 361/751 |

FOREIGN PATENT DOCUMENTS

| CN | 1220078 | 6/1999 |
| CN | 1277696 | 12/2000 |
| CN | 1301130 | 6/2001 |
| CN | 1361471 | 7/2002 |
| JP | 8-54985 | * 2/1997 |
| JP | 10-91345 | 10/1998 |

* cited by examiner

*Primary Examiner*—Jeffery Hofsass
*Assistant Examiner*—Sisay Yacob
(74) *Attorney, Agent, or Firm*—McKenna Long & Aldridge LLP

(57) ABSTRACT

A touch panel device includes a wiring terminal, a flexible printed circuit film connected to the wiring terminal, an adhesion part corresponding to a location where the flexible printed circuit film is connected to the wiring terminal, and an adhesion-reinforcing part adjacent to the adhesion part for strengthening an adhesive bonding strength of the adhesion part.

18 Claims, 9 Drawing Sheets

TOUCH PANEL DEVICE AND METHOD OF FABRICATING THE SAME

The present invention claims the benefit of Korean Patent Application No. P2002-051858 filed in Korea on Aug. 30, 2002, which is hereby incorporated by reference.

BACKGROUND OF THE INVENTION

1. Field of the Invention

The present invention relates to a panel device and method of fabricating a panel device, and more particularly to a touch panel device and method of fabricating a touch panel device.

2. Description of the Related Art

A touch panel device is an integrated input device where image positions of function keys that are displayed on a picture display device are pressed with a finger or stylus to select or enter instructional information. The touch panel device has been commonly incorporated in automatic teller machines (ATMs) and portable information equipment, such as portable digital assistants (PDAs), notebook computers, and desk top computers. The touch panel devices commonly include a resistive touch panel that uses an analog input method integrated with a liquid crystal display panel. The liquid crystal display panel controls light transmittance of a liquid crystal material disposed between two substrates to display image data (i.e., a picture).

FIG. 1 is a schematic diagram of a touch panel device and a flexible printed circuit film according to the related art. In FIG. 1, a liquid crystal display device with a touch panel device includes a touch panel device 1, a display panel 2, such as a liquid crystal display panel, and a backlight device 3. In addition, the liquid crystal display device includes a computer system 5 to drive the touch panel device 1, a touch controller 4 connected to the computer system 5, and a signal line 7 of a flexible-printed circuit film (FPC) interconnects the touch controller 4 and the touch panel device 1.

The touch panel device 1 receives power input from the touch controller 4 and supplies coordinate signals to the touch controller 4, wherein the coordinate signals are generated when a portion of the touch panel device 1 is contacted with a stylus or finger. The computer system 5, which may comprise a main board of a personal computer PC, supplies necessary drive signals and video data to the display panel 2 and supplies necessary power to the touch panel device 1 to control the display panel 2 and the touch panel device 1. The touch controller 4 converts the power input from the computer system 5 into power suitable for driving the touch panel device 1 and supplies the coordinate signals input from the touch panel device 1 to the computer system 5. The circuit forming the touch controller 4 is mounted on a printed circuit board (not shown) for the touch controller 4.

FIG. 2 is a perspective view of a touch panel device and a display panel according to the related art. In FIG. 2, the signal line 7 of a FPC electrically connecting the touch controller 4 with the touch panel device 1 has a length and location selected in accordance with a location of the touch controller 4 connected to the touch panel device 1. The FPC 7 and the touch controller 4 are installed at an exterior of the touch panel device 1. If the touch controller 4 connected with the FPC 7 is installed at the touch panel device 1, a PCB 6A is covered with a frame to protect the PCB 6A on which a drive circuit of the display panel 2 is mounted.

FIG. 3 is an enlarged plan view of a connection portion between the touch panel device and a flexible printed circuit film of FIG. 2 according to the related art. IN FIG. 3, the FPC 7 is bonded to a signal line 33 located along an edge portion of a touch panel lower substrate 31 using an adhesive to electrically interconnect the touch controller 4 with the touch panel device 1.

FIG. 4 is a cross sectional view of the connection portion between the touch panel device and the flexible printed circuit film of FIG. 3 according to the related art. In FIG. 4, the FPC 7 is bonded to the touch panel device 1 such that one end of the FPC 7 is bonded after the adhesive 38 is applied to the signal line 33 on the lower substrate 31 of the touch panel, thereby interconnecting the touch controller 4 with the touch panel device 1. Accordingly, the signal line 33 and the FPC 7 are bonded together using the adhesive 38, which has a low adhesive bonding strength.

Since the adhesive bonding strength of the signal line 33 and the FPC 7 is low, the FPC 7, which is connected to the touch panel device 1, may fall apart from the signal line 33 when a small force 35 is applied to the touch panel device 1 during assembly processes of the touch panel device 1, or when an external shock and impact 35 is applied after the assembly processes. As a result, stability of the touch panel device 1 is low, whereby significant defects are generated.

SUMMARY OF THE INVENTION

Accordingly, the present invention is directed to a touch panel device and method of fabricating a touch panel device that substantially obviates one or more of the problems due to limitations and disadvantages of the related art.

An object of the present invention is to provide a touch panel device that is adaptive for increasing an adhesive strength of a flexible printed-circuit film with the touch panel device.

Another object of the present invention is to provide a method of fabricating a touch panel device for increasing an adhesive strength of a flexible printed-circuit film with the touch panel device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a touch panel device includes a wiring terminal, a flexible printed circuit film connected to the wiring terminal, an adhesion part corresponding to a location where the flexible printed circuit film is connected to the wiring terminal, and an adhesion-reinforcing part adjacent to the adhesion part for strengthening an adhesive bonding strength of the adhesion part.

In another aspect, a method of fabricating a touch panel device includes forming a wiring terminal, forming a flexible printed circuit film connected to the wiring terminal, forming an adhesion part corresponding to a location where the flexible printed circuit film is connected to the wiring terminal, and forming an adhesion-reinforcing part adjacent to the adhesion part for strengthening an adhesive bonding strength of the adhesion part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
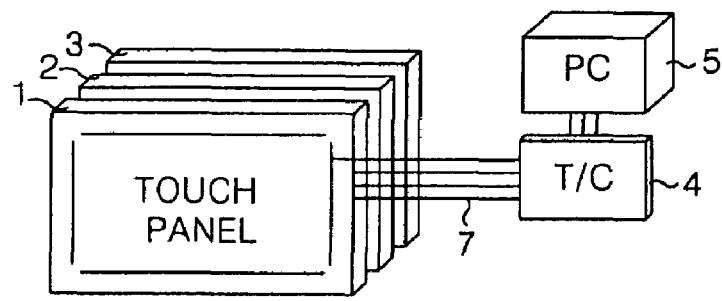
FIG. 1 is a schematic diagram of a touch panel device and a flexible printed circuit film according to the related art.
Figure 2:
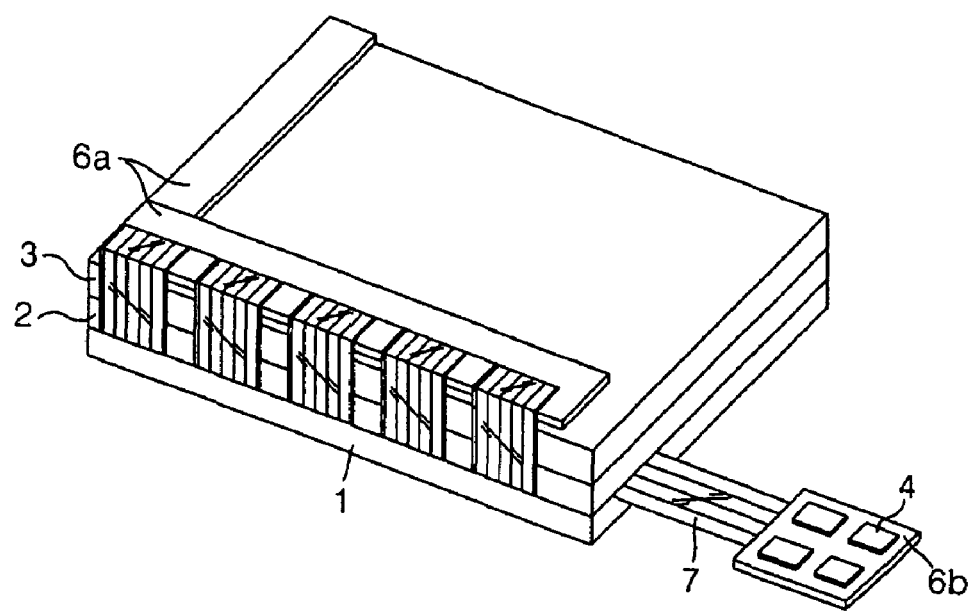
FIG. 2 is a perspective view of a touch panel device and a display panel according to the related art.
Figure 3:
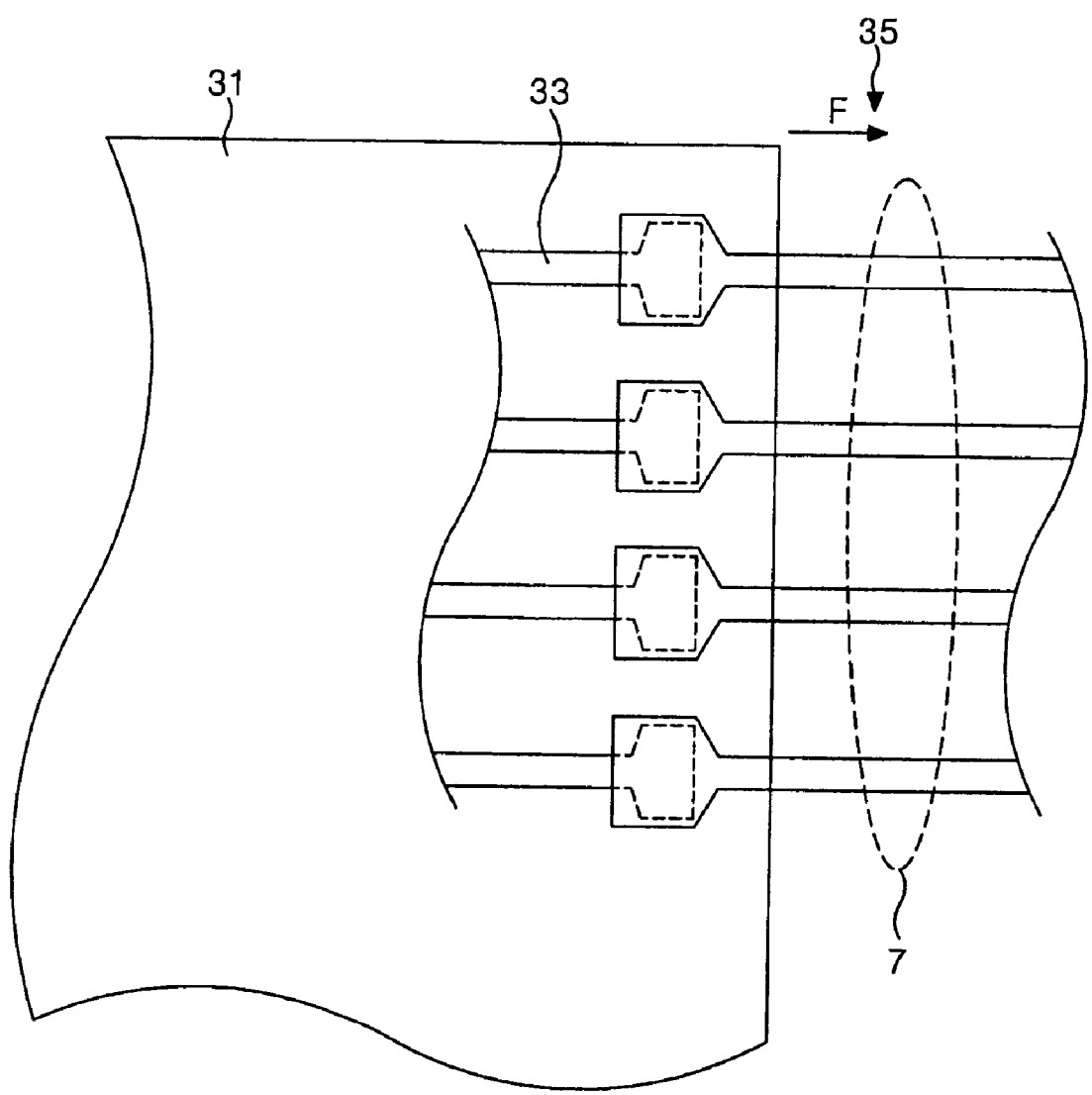
FIG. 3 is an enlarged plan view of a connection portion between the touch panel device and a flexible printed circuit film of FIG. 2 according to the related art.
Figure 4:
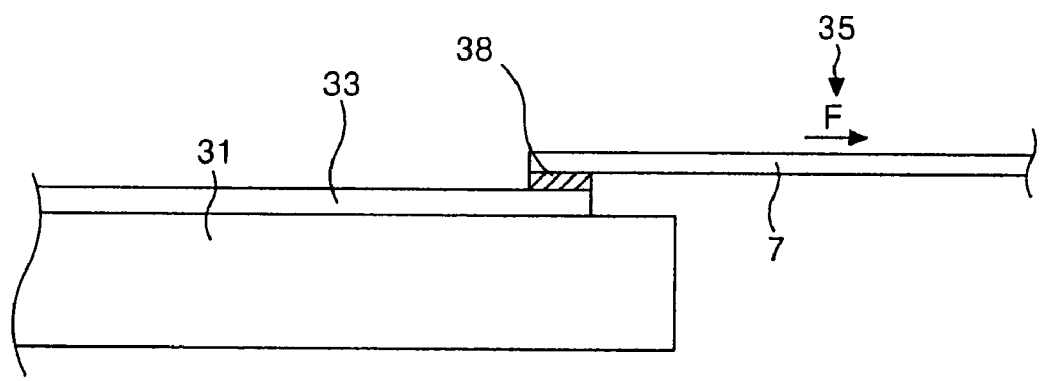
FIG. 4 is a cross sectional view of the connection portion between the touch panel device and the flexible printed circuit film of FIG. 3 according to the related art.
Figure 5:
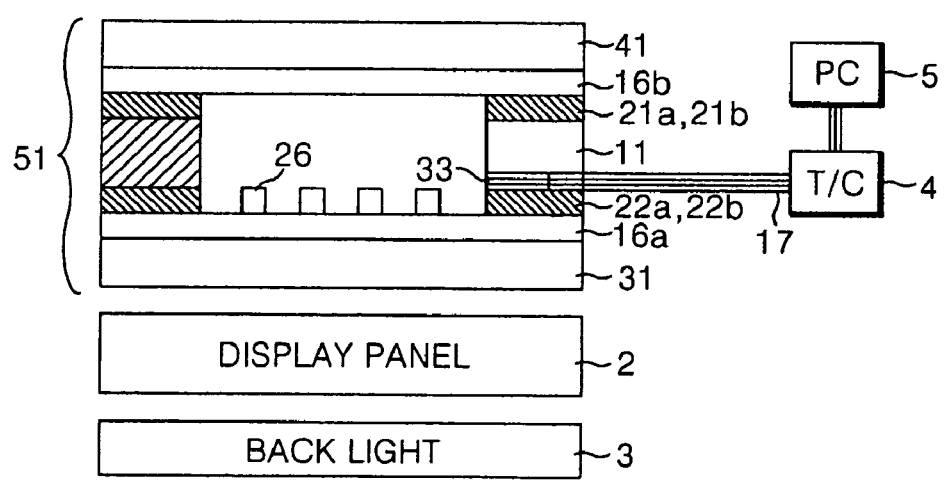
FIG. 5 is a cross sectional view of an exemplary wiring terminal of an exemplary touch panel device according to the present invention.

FIG. 5 is a cross sectional view of an exemplary wiring terminal of an exemplary touch panel device according to the present invention. In FIG. 5, a touch panel device 51 may include an upper plate 41 and a lower plate 31 formed of Indium Tin Oxide (ITO) and Polyethylene Terephthalate (PET), electrodes 21a, 21b, 22a, and 22b formed in each of the lower plate 31 and the upper plate 41, spacers 26 sprayed between the upper plate 41 and the lower plate 31, and a signal line 33 to interconnect the electrodes 21a, 21b, 22a, and 22b of the touch panel device 51 to external components, such as a touch controller 4 and a computer system 5.

The touch panel device 51 receives power input from the touch controller 4 and supplies coordinate signals to the touch controller 4, wherein the coordinate signals may be generated when the upper plate 41 is pressed. The touch controller 4 converts the power input from the computer system 5 into a power suitable for driving the touch panel device 51 and supplies the coordinate signals input from the touch panel device 51 to the computer system 5. The computer system 5 may include a main board of a personal computer PC, and may supply necessary drive signals and video data to the display panel 2. In addition, the computer system 5 may supply necessary power to the touch panel device 51 to control the display panel 2 and the touch panel device 51. Further, the computer system 5 may function to interpret an instruction corresponding to the coordinated signals input from the touch panel device 51 in order to execute corresponding instructions or execute an application program thereto.

Conductive layers 16a and 16b may be formed on the upper plate 41 and the lower plate 31 by screen-printing a transparent conductive material, such as Indium Tin Oxide (ITO), Indium Zinc Oxide (IZO), and Indium Tin Zinc Oxide (ITZO), or depositing the transparent conductive material across entire surfaces of the upper and lower plates 41 and 31.

Figure 6:
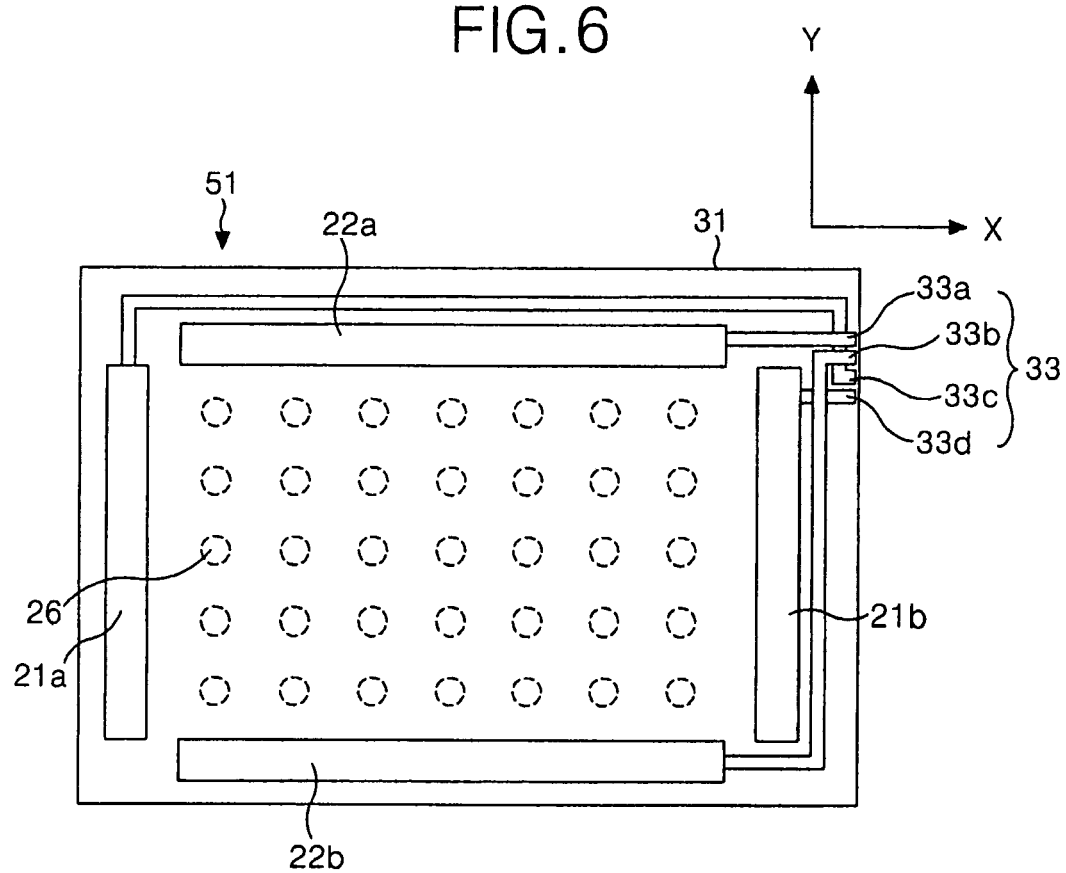
FIG. 6 is a plan view of the exemplary wiring terminal of the exemplary touch panel device according to the present invention.

FIG. 6 is a plan view of the exemplary wiring terminal of the exemplary touch panel device according to the present invention. In FIG. 6, electrodes 21a, 21b, 22a, and 22b, which may include silver Ag, may be formed on the upper plate 41 and the lower plate 31 upon which the conductive layers 16a and 16b (in FIG. 5) may have been previously spread. The electrodes 22a and 22b may formed along an X-axis direction and may be located along an edge portion of the upper plate 41. The electrodes 21a and 21b may be formed along an Y-axis direction and may be located along an edge portion of the lower plate 31.

If a voltage is supplied to the electrodes 21a, 21b, 22a, and 22b, a first electrode layer may be formed by electrical flow generated between the electrodes 22a and 22b formed along the X-axis direction, and a second electrode layer may be formed by electrical flow generated between the electrodes 21a and 21b formed along the Y-axis direction. A portion of the first electrode layer may be shorted with a portion of the second electrode layer of the lower plate 31 when a region of the upper plate 41 is pressed with a stylus or a finger, for example. Accordingly, the touch panel device 51 may generate a signal having a current amount or a voltage level that varies in accordance with a location of the shorted regions. Thus, the signal may be supplied to the touch controller 4 through four signal lines 33a, 33b, 33c, and 33d to cause the computer system 5 to recognize the coordinates of the location where a user presses the touch panel device 51.

The signal lines 33a and 33b formed on the upper plate 41 may be connected to the electrodes 22a and 22b formed along the X-axis direction to project linearly along a first side of the touch panel device 51. The signal lines 33c and 33d formed on the upper plate 31 may be connected to the electrodes 21a and 21b formed along the Y-axis direction to project linearly along a second side of the touch panel device 51. The signal lines 33a and 33b may be formed so as not to overlap with the signal lines 33c and 33d that project from the lower plate 31. Accordingly, the signal lines 33a, 33b, 33c, and 33d may be gathered together at a portion of one side of the touch panel device 51.

The signal lines 33a, 33b, 33c, and 33d may be connected to the FPC 17 to transmit electrical signals from the electrodes 21a, 21b, 22a, and 22b to the touch controller 4 and may supply power converted at the touch controller 4 to the electrodes 21a, 21b, 22a, and 22b. Accordingly, whether the signal lines 33a, 33b, 33c, and 33d are connected to the FPC 17 may be directly related to whether the touch panel device 51 functions properly or not.

Figure 7:
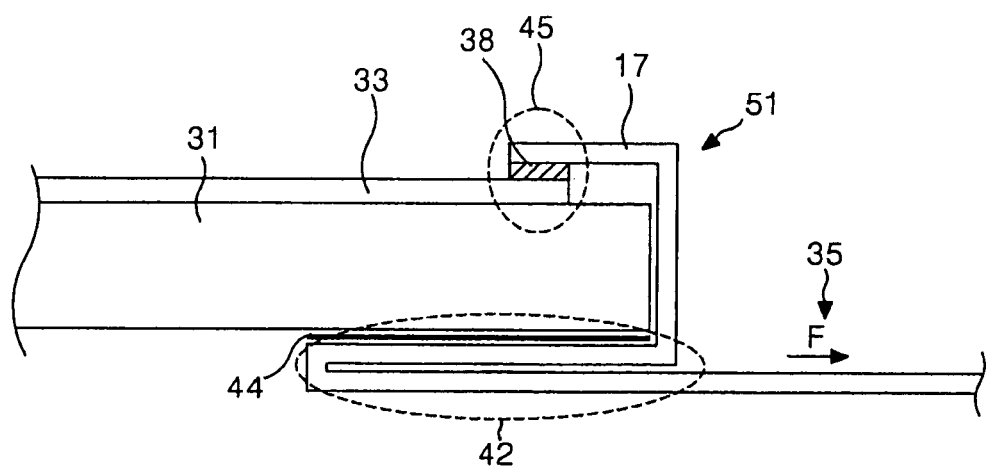
FIG. 7 is a cross sectional view of an exemplary connection portion between a touch panel device and a flexible printed circuit film according to the present invention.

FIG. 7 is a cross sectional view of an exemplary connection portion between a touch panel device and a flexible printed circuit film according to the present invention. In FIG. 7, a touch panel device 51 may include a signal line 33 connected to external portions of the touch panel device 51 formed along a first side thereof, an adhesion part 45 where one end of the signal line 33 may be bonded to an FPC 17, an adhesion-reinforcing part 42 formed along a bottom surface of the adhesion part 45 to prevent an external force 35 from being applied directly to the adhesion part 45 after the FPC 17 is bonded to one side of the signal line 33, and a double-sided tape 44 may be used in the adhesion-reinforcing part 42. The signal line 33 may be formed in a pattern similar to a line pattern of the FPC 17.

In the adhesion part 45, the FPC 17 may be mounted on an adhesive 38 spread on one end of the signal line 33 to electrically interconnect the touch panel device 51 with the FPC 17. Accordingly, the adhesion part 45 of the signal line 33 and the FPC 17 may be bonded for the line pattern of the FPC 17 to coincide with the signal line 33 pattern of the touch panel device 51.

In the adhesion-reinforcing part 42, at least one end of the adhesion part 45 may be bent toward a bottom side of the adhesion part 45 to expose a portion of the FPC 17. Then, the FPC 17 may be bonded to the double-sided tape 44 to be affixed on the bottom surface of the adhesion part 45. That is, the FPC 17 may be bent toward the rear surface of the lower substrate of the touch panel device 51 and may include a bend part bent in a "U" shape in the rear surface of the touch panel device 51. The double-sided tape 44 may be disposed between the bend part and the rear surface of the touch panel device 15 to bond the bend part to the rear surface of the touch panel device 51.

Accordingly the touch panel device 51 may absorb external forces applied to the adhesion part 45 since the touch panel device 51 includes the adhesion-reinforcing part 42 having the FPC 17 affixed using the double-sided tape 44. In addition, adhesive bonding strength between the FPC 17 and the touch panel device 51 increases due to a widened adhesive area, thereby improving the stability of the touch panel device 51 and decreasing the generation of defects.

Figure 8:
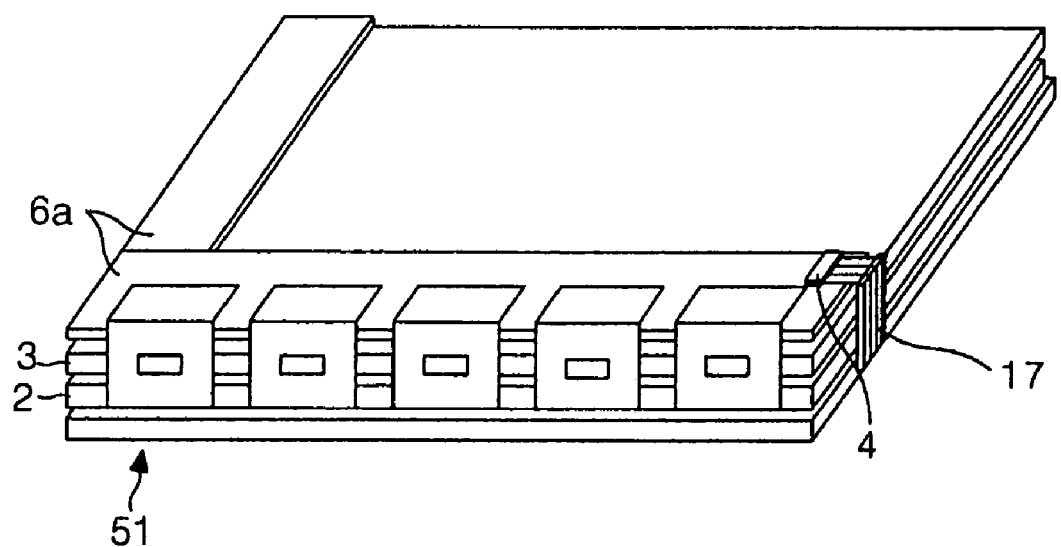
FIG. 8 is a perspective view of another exemplary connection portion between a touch panel device and a flexible printed circuit film according to the present invention.

FIG. 8 is a perspective view of another exemplary connection portion between a touch panel device and a flexible printed circuit film according to the present invention. In FIG. 8, a touch panel device 51 may include a signal line 33 connected to external components formed along one side thereof, an adhesion part (not shown) where one end of the signal line 33 may be bonded to an FPC 17, a cover shield (not shown) bonded to an entire surface of a PCB 6a of a display panel, and an adhesion-reinforcing part (not shown) having the cover shield and the PCB 6a to prevent an external force from being applied directly to the adhesion part (not shown). Since the structure of the touch panel device 51 may be the same as the structure shown in FIGS. 5 and 6, descriptions of the touch panel will be omitted.

Figure 9:
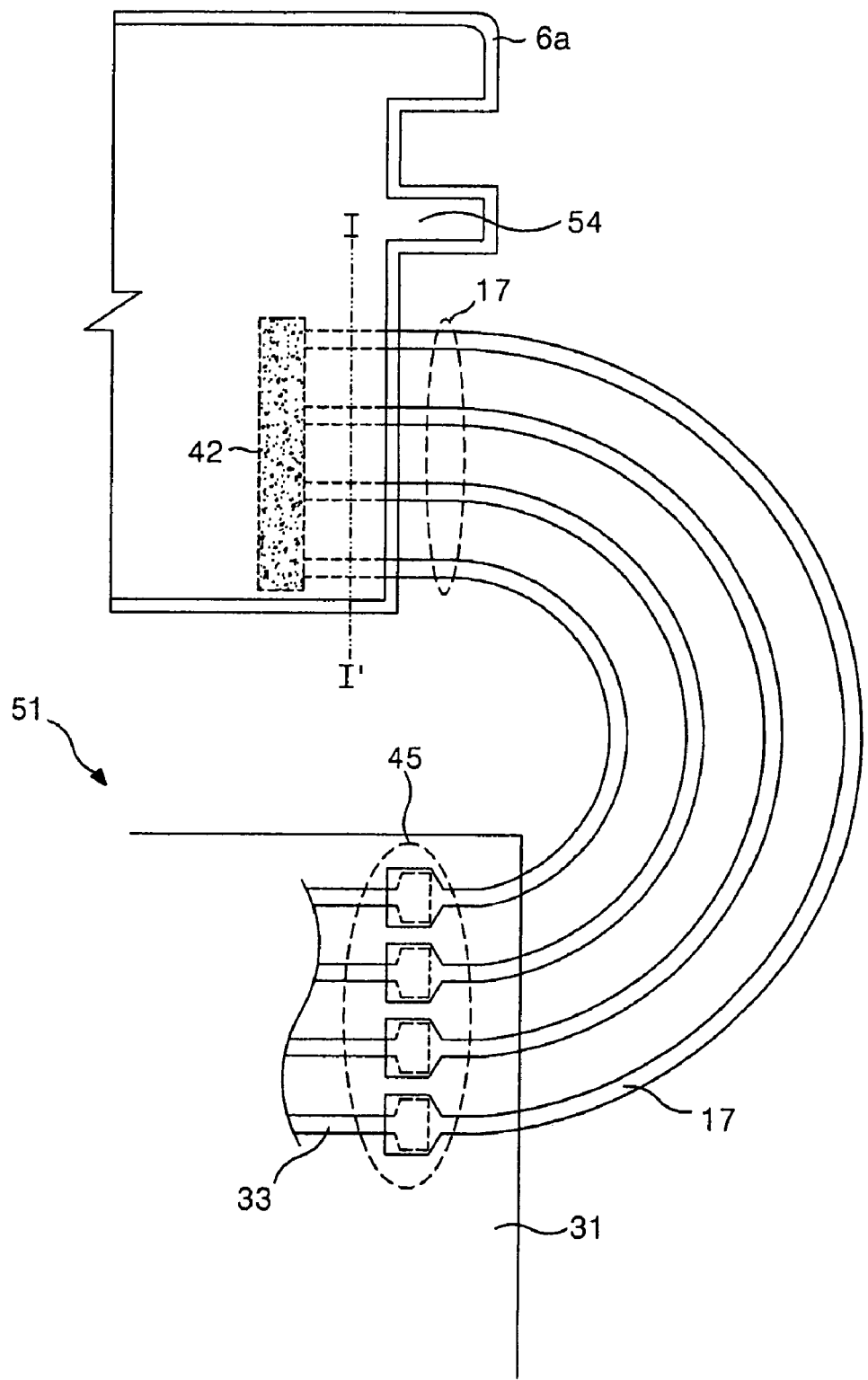
FIG. 9 is an enlarged plan view of another exemplary connection portion between a touch panel device and a flexible printed circuit film according to the present invention.

FIG. 9 is an enlarged plan view of another exemplary connection portion between a touch panel device and a flexible printed circuit film according to the present invention. In FIG. 9, a signal line 33 may be formed having a similar pattern to a line pattern of a FPC 17. In an adhesion part 45, the FPC 17 may be mounted on an adhesive (not shown) spread on one end of the signal line 33 to electrically interconnect the touch panel device 51 with the FPC 17. The adhesion part 45 of the signal line 33 and the FPC 17 may be bonded for a line pattern of the FPC 17 to coincide with the signal line 33 pattern of the touch panel device 51.

In the adhesion-reinforcing part 42, as shown in FIGS. 8 and 9, the FPC 17 exposed to an exterior at one end of the adhesion part 45 may be bent toward the bottom side of the adhesion part 45, and part of the touch controller 4 and the FPC 17 may be bonded onto the PCB 6a of the display panel 2 that is located in the rear surface of a backlight device 3 and the display panel 2. Accordingly, a cover shield 54 may be bonded onto the PCB 6a of the display panel 2.

Figure 10:
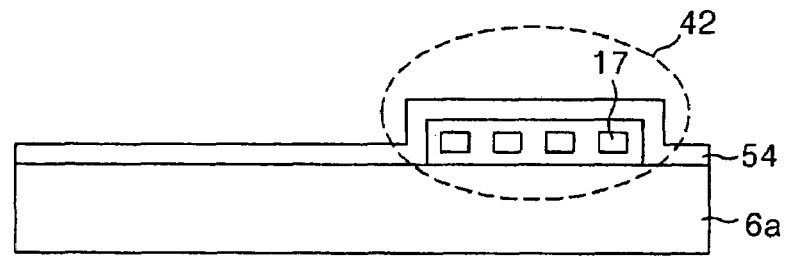
FIG. 10 is a cross sectional view of the exemplary connection portion between the touch panel device and the flexible printed circuit film along I–I' of FIG. 9 according to the present invention.

FIG. 10 is a cross sectional view of the exemplary connection portion between the touch panel device and the flexible printed circuit film along I–I' of FIG. 9 according to the present invention. In FIG. 10, the cover shield 54 may be formed on an entire surface of the PCB 6a that is connected to the display panel 2 to cover the FPC 17 and the touch controller 4, and may function to protect the FPC 17 and the touch controller 4 that are bonded onto the PCB 6a. Accordingly, since the cover shield 54 covers the FPC 17 and the touch controller 4, an adhesive bonding area and a bonding strength of the adhesion-reinforcing part 42 may increase. Thus, the touch panel device 51 may include the adhesion-reinforcing part 42 where the cover shield 54 covers the PCB 6a of the display panel 2, thereby absorbing a specific portion of any external force applied to the adhesion part 45.

Furthermore, since the FPC 17 and the touch controller 4 may be bonded to the PCB 6a that is connected to the display panel 2, the FPC 17 and the touch controller 4 may not be exposed to an exterior upon assembly of the touch panel device 51. As a result, any applied external force may not affect the touch panel device 51 upon the assembly of the touch panel device 51. Accordingly, the touch panel device 51 increases the adhesive bonding strength between the FPC 17 and the touch panel device 51 and widens an adhesive bonding area, thereby improving the stability of the touch panel device 51 and reducing the generation of defects in the touch panel device 51.

Figure 11:
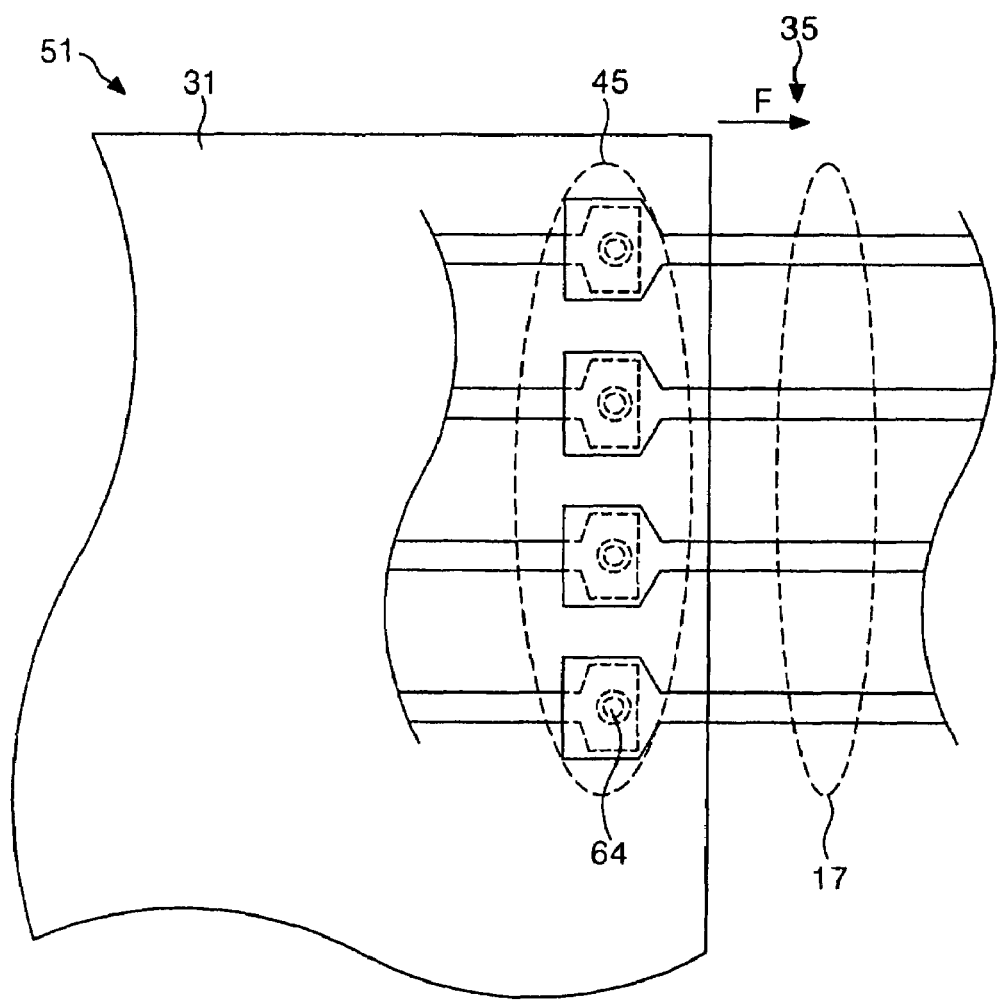
FIG. 11 is a plan view of another exemplary connection portion between a touch panel device and a flexible printed circuit film according to the present invention.

FIG. 11 is a plan view of another exemplary connection portion between a touch panel device and a flexible printed circuit film according to the present invention. In FIG. 11, a touch panel 51 may include a signal line (not shown) connected to an exterior along one side thereof, an adhesion part 45 where one end of the signal line may be bonded to a FPC 17, an adhesion-reinforcing part (not shown) formed on the adhesion part 45 to prevent an external force 35 from being applied directly to the adhesion part 45 after the FPC 17 is bonded to the one end of the signal line, and a solder portion 64 extending through the FPC 17 from the adhesion-reinforcing part to contact the signal line. Since the structure of the touch panel device 51 in FIG. 11 may be similar to the structure of FIGS. 5 and 6, a description of the touch panel will be omitted.

Figure 12:
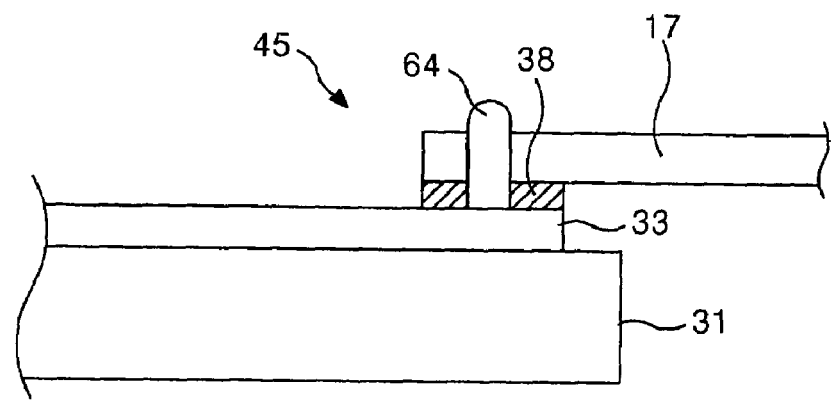
FIG. 12 is a cross sectional view another exemplary connection portion between a touch panel device and a flexible printed circuit film according to the present invention.

FIG. 12 is a cross sectional view another exemplary connection portion between a touch panel device and a flexible printed circuit film according to the present invention. In FIG. 12, a signal line 33 may be formed in a pattern similar to a line pattern of a FPC 17, and may have a width commensurate to a solder portion 64. In an adhesion part 45, the FPC 17 may be mounted on an adhesive 38 spread on one end of the signal line 33 to electrically interconnect a touch panel device 51 with the FPC 17. Accordingly, the adhesion part 45 of the signal line 33 and the FPC 17 may be bonded together, wherein the line pattern of the FPC 17 may coincide with the signal line 33 pattern of the touch panel device 51.

The adhesion-reinforcing part (not shown) may include the solder portion 64 passing through the FPC 17 on the adhesion part 45. Since the solder portion 64 passes through the FPC 17 to contact the signal line 33, the adhesive bonding strength between the FPC 17 and the signal line 33 may increase and the conductivity between the touch controller 4 and the touch panel device 51 may also increase. Accordingly, the touch panel device may include the adhesion-reinforcing part with the solder portion 64, and may absorb a specific portion of any external force 35 applied to the adhesion part 45. Thus, the touch panel device 51 may increase the adhesive bonding strength between the FPC 17 and the touch panel device 51 by widening an adhesive bonding area, thereby improving the stability of the touch panel device 51 to reduce the generation of defects the touch panel.

Figure 13:
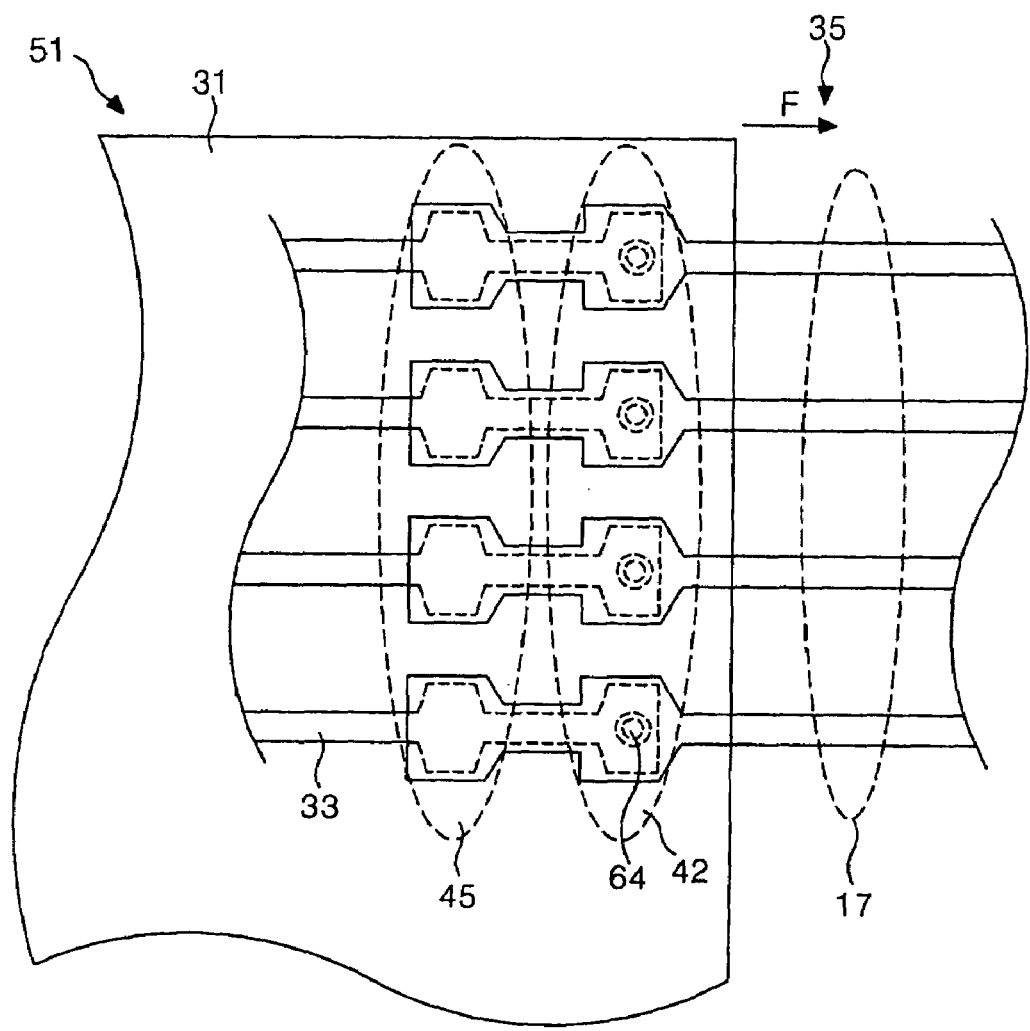
FIG. 13 is a plan view of another exemplary connection portion between a touch panel device and a flexible printed circuit film according to the present invention.

FIG. 13 is a plan view of another exemplary connection portion between a touch panel device and a flexible printed circuit film according to the present invention. In FIG. 13, a touch panel device 51 may include a signal line 33 connected to an exterior on one side thereof, an adhesion part 45 where one end of the signal line 33 may be bonded to the FPC 17, an adhesion-reinforcing part 42 formed to prevent external force 35 from being applied directly to the adhesion part 45 after the FPC 17 is bonded to the one end of the signal line 33, and a solder portion 64 extending through the FPC 17 from the adhesion-reinforcing part 42 to contact the signal line 33. Since the structure of the touch panel device 51 may be the same as the structure shown in FIGS. 5 and 6, description on the touch panel will be omitted. The signal line 33 may be formed having a pattern similar to a line pattern of the FPC 17, and having a width for the solder portion 64.

Figure 14:
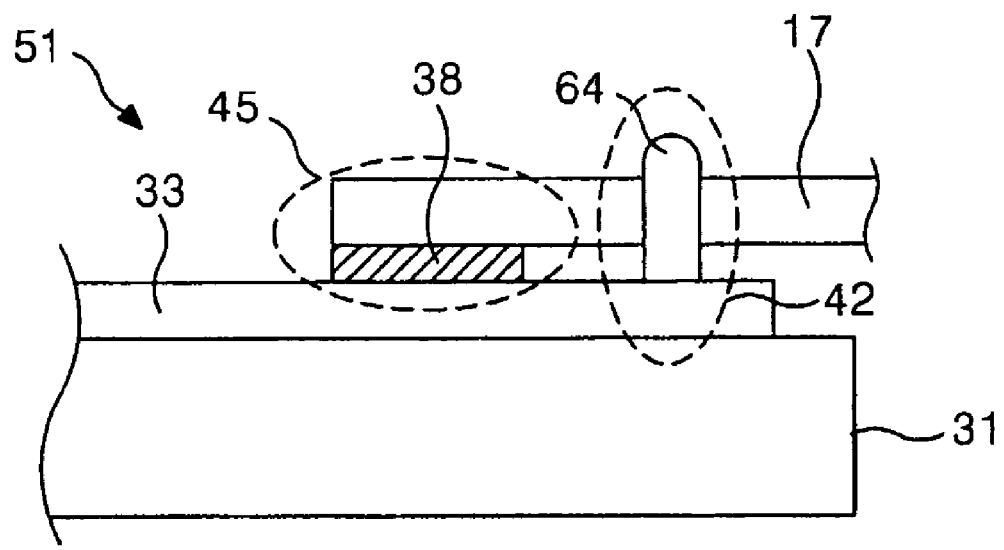
FIG. 14 is a cross sectional view of another exemplary connection portion between a touch panel device and a flexible printed circuit film according to the present invention.

FIG. 14 is a cross sectional view of another exemplary connection portion between a touch panel device and a flexible printed circuit film according to the present invention. In an adhesion part 45, as shown in FIG. 14, an FPC 17 may be mounted on an adhesive 38 spread on one end of a signal line 33 to electrically interconnect a touch panel device 51 with the FPC 17. Accordingly, the adhesion part 45 of the signal line 33 and the FPC 17 may be bonded for a line pattern of the FPC 17 to coincide with the signal line 33 pattern of the touch panel device 51.

In FIG. 14, an adhesion-reinforcing part 42 may include a solder portion 64 passing through the FPC 17 on the adhesion part 45. Since the solder portion 64 passes through the FPC 17 at a place between the adhesive 38 and the end of the signal line 33 to contact the signal line 33, the adhesive bonding strength between the FPC 17 and the signal line 33 increases and conductivity between the touch controller 4 and the touch panel device 51 increases. Accordingly, the touch panel device 51 may include the adhesion-reinforcing part 42 with the solder portion 64, thereby absorbing a specific portion of any external force 35 applied to the adhesion part 45.

Furthermore, in FIG. 14, the touch panel device 51 may not include a soldered adhesion portion 45, but may include an adhesion-reinforcing part 42 where only the solder 64 may be formed, thus the solder portion 64 may be completely formed regardless of bonding properties of the adhesive 38.

Accordingly, the touch panel device 51 may increase the adhesive bonding strength between the FPC 17 and the touch panel device 51 by widening an adhesive bonding area, thereby improving the stability of the touch panel 51 to reduce the generation of defects in the touch panel.

As described above, the touch panel may include the adhesion part where the FPC may be bonded to the one end of the signal line, and may further include the adhesion-reinforcing part to absorb any external force applied directly to the adhesion part. Accordingly, the adhesive bonding strength of the signal line and the FPC increases, and the adhesive bonding area broadens, thereby preventing easy separation between the FPC and the touch panel. As a result, the touch panel can secure the stability of the touch panel and reduce the defect rate of the touch panel owing to the improvement of the adhesive strength between the FPC and the touch panel.

It will be apparent to those skilled in the art that various modifications and variations can be made in the touch panel device and method of fabricating a touch panel device of the present invention without departing from the spirit or scope of the invention. Thus, it is intended that the present invention cover the modifications and variations of this invention provided they come within the scope of the appended claims and their equivalents.

What is claimed is:

1. A touch panel device having a first substrate and a second substrate, comprising:
   a wiring terminal formed on a front surface of any one of the first and second substrates;
   a flexible printed circuit film connected to the wiring terminal;
   an adhesion part substantially corresponding to a location where the flexible printed circuit film is connected to the wiring terminal; and
   an adhesion-reinforcing part formed on a rear surface of the substrate on which the wiring terminal is formed to strengthen a bonding strength of the adhesion part.

2. The device according to claim 1, wherein the flexible printed circuit film includes a bend part where the flexible printed circuit film is bent toward a rear surface of the touch panel device at the adhesion part and includes a substantially "U" shaped portion at the rear surface of the touch panel.

3. The device according to claim 2, wherein the adhesion-reinforcing part includes the bend part and a double-sided tape that bonds the bend part to the rear surface of the touch panel.

4. The device according to claim 1, further comprising:
   a touch controller for reading a coordinate signal transmitted from the touch panel to control the touch panel; and
   a printed circuit board upon which the touch controller is mounted and to which the flexible printed circuit film is bonded.

5. The device according to claim 4, wherein the adhesion-reinforcing part is formed on a surface of the printed circuit board to cover the touch controller and the flexible printed circuit film.

6. The device according to claim 1, wherein the adhesion-reinforcing part includes a solder portion that passes through the adhesive part and contacts the wiring terminal.

7. The device according to claim 1, wherein the adhesion-reinforcing part includes a solder portion that passes through the flexible printed circuit film at a region between an end portion of the wiring terminal and the adhesive part on one side of the wiring terminal, and contacts the wiring terminal.

8. The device according to claim 1, further comprising:

spacers disposed in a space between an upper substrate and a lower substrate;

a first electrode layer formed at a rear surface of the upper substrate;

a first signal line extending from the first electrode layer to electrically connect with the wiring terminal;

a second electrode layer formed on the lower substrate; and a second signal line extending from the second electrode layer to electrically connect with the wiring terminal.

9. The device according to claim 1, further comprising:

a display panel; and a backlight device disposed on a rear surface of the display panel to radiate light to the display panel.

10. A method of fabricating a touch panel device having a first substrate and a second substrate, comprising:

forming a wiring terminal formed on a front surface of any one of the first and second substrates;

forming a flexible printed circuit film connected to the wiring terminal;

forming an adhesion part corresponding to a location where the flexible printed circuit film is connected to the wiring terminal; and forming an adhesion-reinforcing part on a rear surface of the substrate on which the wiring terminal is formed wherein the adhesion-reinforcing part increases an adhesive bonding strength of the adhesion part.

11. The method according to claim 10, wherein the flexible printed circuit film includes a bend part where the flexible printed circuit film is bent toward a rear surface of the touch panel device at the adhesion part and includes a substantially "U" shaped portion at the rear surface of the touch panel.

12. The method according to claim 11, wherein the adhesion-reinforcing part includes the bend part and a double-sided tape that bonds the bend part to the rear surface of the touch panel.

13. The method according to claim 10, further comprising:

providing a touch controller for reading a coordinate signal transmitted from the touch panel to control the touch panel; and providing a printed circuit board upon which the touch controller is mounted and to which the flexible printed circuit film is bonded.

14. The method according to claim 13, wherein the adhesion-reinforcing part is formed on a surface of the printed circuit board to cover the touch controller and the flexible printed circuit film.

15. The method according to claim 10, wherein the adhesion-reinforcing part includes a solder portion that passes through the adhesive part and contacts the wiring terminal.

16. The method according to claim 10, wherein the adhesion-reinforcing part includes a solder portion that passes through the flexible printed circuit film at a region between an end portion of the wiring terminal and the adhesive part on one side of the wiring terminal, and contacts the wiring terminal.

17. The method according to claim 10, further comprising:

forming spacers within a space between an upper substrate and a lower substrate;

forming a first electrode layer formed at a rear surface of the upper substrate;

forming a first signal line extending from the first electrode layer to electrically connect with the wiring terminal;

forming a second electrode layer formed on the lower substrate; and forming a second signal line extending from the second electrode layer to electrically connect with the wiring terminal.

18. The method according to claim 10, further comprising:

providing a display panel; and providing a backlight device at a rear surface of the display panel to radiate light to the display panel.

* * * * *